United States Patent
Kato et al.

(10) Patent No.: US 11,240,915 B2
(45) Date of Patent: Feb. 1, 2022

(54) METHOD FOR MANUFACTURING MULTILAYER WIRING BOARD

(71) Applicant: Lincstech Co., Ltd., Tokyo (JP)

(72) Inventors: Masahiro Kato, Tokyo (JP); Eiichi Shinada, Tokyo (JP); Yuto Tanabe, Tokyo (JP)

(73) Assignee: Lincstech Co., Ltd., Tokyo (JP)

( * ) Notice: Subject to any disclaimer, the term of this patent is extended or adjusted under 35 U.S.C. 154(b) by 274 days.

(21) Appl. No.: 16/307,499

(22) PCT Filed: Jun. 5, 2017

(86) PCT No.: PCT/JP2017/020831
§ 371 (c)(1),
(2) Date: Dec. 6, 2018

(87) PCT Pub. No.: WO2017/213086
PCT Pub. Date: Dec. 14, 2017

(65) Prior Publication Data
US 2019/0350083 A1    Nov. 14, 2019

(30) Foreign Application Priority Data
Jun. 6, 2016  (JP) .............................. JP2016-112674

(51) Int. Cl.
*H05K 3/00* (2006.01)
*H05K 3/40* (2006.01)
(Continued)

(52) U.S. Cl.
CPC ......... *H05K 3/0094* (2013.01); *H05K 3/4007* (2013.01); *H05K 3/429* (2013.01);
(Continued)

(58) Field of Classification Search
CPC .... H05K 3/0094; H05K 3/4007; H05K 3/429; H05K 3/462; H05K 3/4632;
(Continued)

(56) References Cited

U.S. PATENT DOCUMENTS

2003/0102151 A1* 6/2003 Hirose ..................... H05K 1/03
174/250
2006/0029726 A1* 2/2006 Mok ...................... H05K 3/462
427/96.1

(Continued)

FOREIGN PATENT DOCUMENTS

JP    H09-162553 A    6/1997
JP    H11-87870 A     3/1999
(Continued)

*Primary Examiner* — Minh N Trinh
(74) *Attorney, Agent, or Firm* — Faegre Drinker Biddle & Reath LLP

(57) ABSTRACT

A method for manufacturing a multilayer wiring board is disclosed. The method includes steps of preparing printed wiring boards having both electrical connection pads for establishing an electrical connection between the boards and non-connection pads for not establishing an electrical connection between the boards on the same plane, overlaying the boards so that the electrical connection pads face each other, and laminating the boards so that the boards are bonded to each other through a conductive paste provided between the facing electrical connection pads. To prepare the printed wiring boards, attach an insulating film to at least one of surfaces faced when the boards are overlaid in the overlaying, bore holes in the insulating film so that the electrical connection pads are exposed, and provide a conductive paste in the holes.

14 Claims, 4 Drawing Sheets

(51) Int. Cl.
*H05K 3/42* (2006.01)
*H05K 3/46* (2006.01)

(52) U.S. Cl.
CPC ........... *H05K 3/462* (2013.01); *H05K 3/4632* (2013.01); *H05K 3/4638* (2013.01)

(58) Field of Classification Search
CPC .. H05K 3/4638; H05K 3/4611; H05K 3/4614; H05K 3/4617; H05K 3/4602
See application file for complete search history.

(56) References Cited

U.S. PATENT DOCUMENTS

| | | | |
|---|---|---|---|
| 2006/0272850 A1* | 12/2006 | Morimoto | H05K 3/4617 174/254 |
| 2007/0289706 A1* | 12/2007 | Nakagawa | H05K 3/4614 156/306.9 |
| 2012/0017437 A1* | 1/2012 | Das | B23K 26/40 29/852 |
| 2012/0111616 A1* | 5/2012 | Inoue | B23K 1/0016 174/257 |

FOREIGN PATENT DOCUMENTS

| | | |
|---|---|---|
| JP | 2000-286553 A | 10/2000 |
| JP | 2001-160686 A | 6/2001 |
| JP | 2002-198656 A | 7/2002 |
| JP | 2002-329967 A | 11/2002 |
| JP | 2003-334886 A | 11/2003 |
| JP | 2004-288989 A | 10/2004 |
| JP | 2004288989 A * | 10/2004 |
| JP | 2007-335701 A | 12/2007 |
| JP | 5874343 B2 | 3/2016 |

* cited by examiner

METHOD FOR MANUFACTURING MULTILAYER WIRING BOARD

TECHNICAL FIELD

The present invention relates to a method for manufacturing a multilayer wiring board.

BACKGROUND ART

Most components designed to be mounted on multilayer wiring boards are based on surface mount technology, and connection parts for establishing a connection between components and multilayer wiring boards have been made smaller year by year. Further, as the number of mount components has been increasing more and more, it has been required to reduce the pitch of holes to be foliated in multilayer wiring boards and to increase the number of wiring circuit layers.

A typical multilayer wiring board is an integrated laminate in which double-sided copper-clad laminates on which a wiring circuit is formed and insulating adhesive layers alternate, and has a structure (through holes) such that holes passing through the multilayer wiring board are formed in needed portions and the interior walls of the holes are plated so that an electrical connection is established between circuits on the respective layers.

However, since through holes extend in the entire thickness direction of the printed wiring board, at the positions of the through holes in the plan view, in the wiring circuit layer other than the wiring circuit layers needed for connection, the circuit patterns are disposed away from the through holes in order to avoid electrical connection with the through holes. For this reason, it is difficult to improve the wiring density in the through hole structure.

To solve this problem, a method for manufacturing a multilayer wiring board having a through hole-less structure for establishing a connection between the layers through a conductive paste has been proposed as a structure not using through holes. For example, the one described below is well known.

Patent Literature 1 discloses a method for forming a multilayer wiring board by providing holes in a thin prepreg, which is prepared by impregnating a non-woven fabric with a thermosetting resin so that it is set in the semi-cured state; filling the holes with a conductive paste; overlaying two double-sided circuit boards (each board includes an insulating substrate having a layer of a circuit pattern on both sides) on each other with the prepreg therebetween; heating and pressurizing the workpiece for adhesion such that the circuits on the two double-sided circuit boards are electrically connected to each other through the conductive paste in the holes in the prepreg.

Patent Literature 2 discloses a method for forming an interlayer connection part consisting of conductive bumps, by forming conductive bumps, which have a mountain shape or a substantially conical shape, on a conductive plate, and press-inserting the conductive bumps in an insulating prepreg substrate which is softened by heating.

Patent Literature 3 discloses a method for manufacturing a multilayer wiring board by providing an adhesive resin sheet, which has odd-shaped via holes with an opening area determined according to the conductor area rate, between circuit boards having a plurality of regions with different conductor area rates, filling the odd-shaped via holes with a conductive paste, and hot-pressing the workpiece.

CITATION LIST

Patent Literature

Patent Literature 1: Japanese Unexamined Patent Publication No. H11-87870
Patent Literature 2: Japanese Unexamined Patent Publication No. 119-162553
Patent Literature 3: Japanese Patent No. 5874343

SUMMARY OF INVENTION

Technical Problem

Most components designed to be mounted on multilayer wiring boards are based on surface mount technology, and connection terminals for establishing a connection between components and multilayer wiring boards have been made smaller year by year. Further, as the number of mount components has been increasing year by year, it has been required to reduce the pitch of holes for an electrical connection between multilayer wiring boards and to increase the number of signal lines.

In the field of large and thick multilayer wiring boards having a board thickness of greater than 5 mm, typified by mother boards and boards for jigs for semiconductor testing, it has been required to reduce the pitch of the holes for an electrical connection between multilayer wiring boards, to increase the number of signal lines, and the like along with the miniaturization and pitch reduction of the inspection parts and mounted parts.

Forming a small-diameter through hole in a board with a large board thickness has a risk of drill breaking and also has a problem in the accuracy of alignment for forming the through hole from the front and back sides. Besides, it is difficult to form plating with preferred throwing power, which is the ratio of plating thicknesses in the vicinity of the entrance of the through hole and in the central part of the through hole at the time of plating; thus, it would conventionally be very difficult to manufacture a board with an aspect ratio (the value obtained by dividing the board thickness by the diameter of the through hole) exceeding 25. For this reason, regarding a multilayer wiring board in which interlayer connection is achieved only by a through-hole structure with holes passing through the entire board thickness, it is difficult to provide a multilayer wiring board in which the pitch can be reduced due to an increase in the aspect ratio; therefore, the methods of manufacturing multilayer wiring boards described in Patent Literatures 1 to 3 and the like have been proposed.

In the method for manufacturing a multilayer wiring board described in. Patent Literature 1, interlayer connection is achieved using a conductive paste in holes provided in a prepreg containing a nonwoven fabric, so that the connection pads have different heights due to variations in the thickness of the nonwoven fabric contained in the prepreg; thus, the problem arises that the connection resistance becomes unstable. For this reason, it is probably difficult to perform machining with high positional accuracy for a multilayer wiring board in which mounted parts having minute junction terminal pitches are mounted at high density.

In the method for manufacturing a multilayer wiring board described in Patent Literature 2, pressure is applied to conductive bumps with a high aspect ratio at the time of insertion of the bumps, so that breakage of the conductive bumps may occur and the bumps may be prevented from appropriately passing through due to variations in the heights of the bumps and the warpage of the printed wiring board, which may cause problems in yield and reliability.

In the method for manufacturing a multilayer wiring board described in Patent Literature 3, an adhesive resin sheet provided with odd-shaped via holes having different opening area ratios to be filled with a conductive material is used, voids tend to be formed next to the odd-shaped via holes at the time of filling with a conductive paste, and the voids cause a flow of the conductive material, so that a short circuit failure may occur.

An object of the present invention, which has been made in consideration of the above situation, is to provide a manufacturing method for easily fabricating a high-density multilayer wiring board having excellent connection reliability, a large board thickness, small-diameter holes with small pitches for electrical connections, and minute junction terminal pitches.

Solution to Problem

A method for manufacturing a multilayer wiring board of the present invention relates to the following aspects.

First, the present invention is a method for manufacturing a multilayer wiring board, comprising: a printed wiring board manufacturing step (I) of preparing a plurality of printed wiring boards having both electrical connection pads for establishing an electrical connection between the printed wiring boards and non-connection pads for not establishing an electrical connection between the printed wiring boards on the same plane; and a lamination step (II) of overlaying the plurality of printed wiring boards so that the electrical connection pads face each other, and laminating the plurality of printed wiring boards so that the printed wiring boards are bonded to each other through a conductive paste provided between the facing electrical connection pads, wherein in the printed wiring board manufacturing step (I), (Ia) an insulating film is attached to at least one of surfaces faced when the plurality of printed wiring boards are overlaid in the lamination step (II), (Ib) holes are bored in the insulating film in positions corresponding to the electrical connection pads on the surface having the attached insulating film so that the electrical connection pads are exposed, and (Ic) a conductive paste is provided in the holes formed in the insulating film by this hole-boring. This provides a method for manufacturing a multilayer wiring board that facilitates the fabrication of high-density multilayer wiring boards.

It is preferable that in the printed wiring board manufacturing step (I), a thermosetting resin composition having a glass transition temperature of 180° C. or more be used in the insulating film. This ensures heat-resistant properties of the insulating material even at a temperature at which a conductive paste having a high melting point is processed, thereby fabricating a high-density multilayer wiring board with high reliability.

It is preferable that in the printed wiring board manufacturing step (I), particles, such as a filler, be contained in the insulating film as a reinforcement. This can suppress the coefficient of thermal expansion of the cured product used in the insulating film, thereby fabricating a high-density multilayer wiring board with high reliability.

It is preferable that in the printed wiring board manufacturing step (I), laser processing or hole-boring drilling be used for boring holes in the insulating film (Ib). This allows holes to be formed by a method which is also used in manufacturing a general-use printed wiring board, without choosing a method of hole-boring. It is preferable to employ hole-boring using laser processing which provides holes with a small diameter more easily than that using drilling, leading to easy fabrication of a high-density multilayer wiring board having minute junction terminal pitches.

It is preferable that in the printed wiring board manufacturing step (I), a PET film be used as a protective mask when (Ic) the conductive paste is provided in the holes formed in the insulating film. This allows the PET film adhering to the insulating material in advance to be subjected to hole-boring processing at the same time as hole-boring of the insulating material and to be used as a protective film as it is, thereby eliminating a need for fabricating dedicated protective masks adjusted according to positions where the paste is provided, and facilitating the fabrication of a high-density multilayer wiring board.

It is preferable that in the printed wiring board manufacturing step (I), the printed wiring boards be subjected to heat treatment at a temperature of 70 to 150° C. for 10 to 120 minutes, after (Ic) the conductive paste is provided in the holes formed in the insulating film and before the step (II) of laminating the plurality of printed wiring boards. Thus, by performing heat treatment at a temperature lower than the melting point of the conductive paste after filling with the conductive paste, the viscosity of the conductive paste is increased and the flow of the conductive paste generated by the pressure applied at the time of integral lamination can be decreased, thereby fabricating a high-density multilayer wiring board with high reliability.

It is preferable that in the lamination step (II), a plurality of alignment holes be provided in common portions on the planes of the printed wiring boards to be integrally laminated, and pins be inserted into the provided alignment holes, so that the integral lamination is performed while performing alignment between the printed wiring boards. This facilitates alignment between the plurality of integrally laminated printed wiring boards and thus can suppress misalignment during the lamination, thereby fabricating a high-density multilayer wiring board with high reliability.

It is preferable that in the lamination step (II), a portion of the surface provided with the pads for establishing an electrical connection between the printed wiring boards be filled with an insulating material, the portion being not provided with the pads for establishing an electrical connection between the printed wiring boards. Thus, by preliminarily filling the portion where the electrical connection pads are not provided, before lamination, the conductive paste can be prevented from flowing into the portion where the electrical connection pads are not provided. In addition, the heights of the electrical connection pads can be made uniform, thereby fabricating a high-density multilayer wiring board with high reliability.

It is preferable that in the printed wiring board manufacturing step (I), the insulating film have a thickness larger than a thickness of conductor circuits of the electrical connection pads exposed from the holes formed in the insulating film when (Ib) the holes are bored in the insulating film so that the electrical connection pads are exposed. This can reliably ensure the depths of the holes to be filled with the conductive paste and prevent insufficient adhesion between the layers and a flow of the conductive paste, which is used to ensure electrical connections, out of the holes, thereby fabricating a higher-density multilayer wiring board.

It is preferable that in the printed wiring board manufacturing step (I), the holes formed in the insulating film by hole-boring in positions corresponding to the electrical connection pads be all filled with a conductive paste when (Ib) the holes are bored in the insulating film so that the electrical connection pads are exposed. Thus, by filling all of the holes provided in the insulating film with the conductive paste, generation of voids after integral lamination is avoided and the heights of the conductive bumps provided on the electrical connection pads can be made uniform, thereby fabricating a high-density multilayer wiring board with high reliability.

Advantageous Effects of Invention

A process of the present invention, in which at least two printed wiring boards are integrally laminated together and an electrical connection is established between the printed wiring boards, provides a manufacturing method for easily fabricating a high-density multilayer wiring board having excellent connection reliability, a large board thickness, small-diameter holes with small pitches for electrical connections, and minute junction terminal pitches.

DESCRIPTION OF EMBODIMENTS

Figure 1:
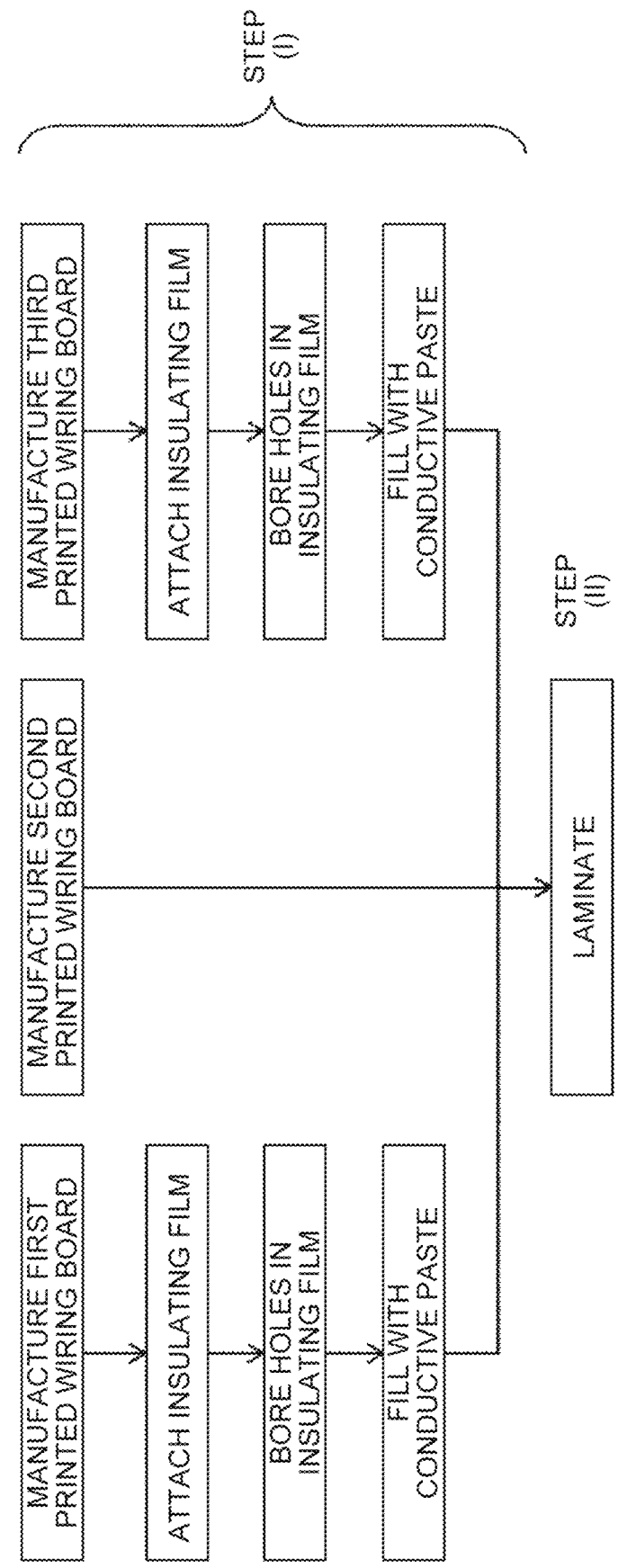
FIG. 1 is a block diagram showing the steps of one embodiment of a method for manufacturing a multilayer wiring board of the present invention.

Embodiments of a method for manufacturing a multilayer wiring board of the present invention will now be described with reference to the drawings, but the present invention is not limited to them. An example of manufacturing a multilayer wiring board in which three printed wiring boards are integrally laminated together is shown below, and the printed wiring boards before integral lamination are shown as a first printed wiring board 1, a second printed wiring board 6, and a third printed wiring board 7.

A method for manufacturing a multilayer wiring board of this embodiment comprises: a printed wiring board manufacturing step (I) of preparing a plurality of printed wiring boards having both electrical connection pads for establishing an electrical connection between the printed wiring boards and non-connection pads for not establishing an electrical connection between the printed wiring boards on the same plane; and a lamination step (II) of overlaying the plurality of printed wiring boards so that the electrical connection pads face each other, and laminating the plurality of printed wiring boards so that the printed wiring boards are bonded to each other through a conductive paste provided between the facing electrical connection pads, wherein in the printed wiring board manufacturing step (I), (Ia) an insulating film is attached to at least one of surfaces faced when the plurality of printed wiring boards are overlaid in the lamination step (II), (Ib) holes are bored in the insulating film in positions corresponding to the electrical connection pads on the surface having the attached insulating film so that the electrical connection pads are exposed, and (Ic) a conductive paste is provided in the holes formed in the insulating film by this hole-boring.

In this embodiment, electrical connection pads refer to pads that establish an electrical connection between printed wiring boards and are layered so that they face each other with a conductive material, which will be described later, interposed therebetween, and since the pads are laminated so that they are bonded to each other through the conductive material, an electrical connection is established between the printed wiring boards. In contrast, non-connection pads refer to pads that are not used to establish an electrical connection between printed wiring boards. In addition, "the first, second, and third printed wiring boards having both the electrical connection pads and the non-connection pads on the same plane" means that the plurality of printed wiring boards, i.e., the first, second, and third printed wiring boards each have both the electrical connection pads and the non-connection pads on at least one of the front and back surfaces thereof; and each of the printed wiring boards may have both the electrical connection pads and the non-connection pads on one of the front and back surfaces thereof but on a different surface from another printed wiring board. For example, the first printed wiring board may have both electrical connection pads and non-connection pads on its front surface, and the second printed wiring board and the third printed wiring board may have both electrical connection pads and non-connection pads on their back surfaces.

<Printed Wiring Board Manufacturing Step (I)>
(Preparation of Printed Wiring Board)

Figure 2:
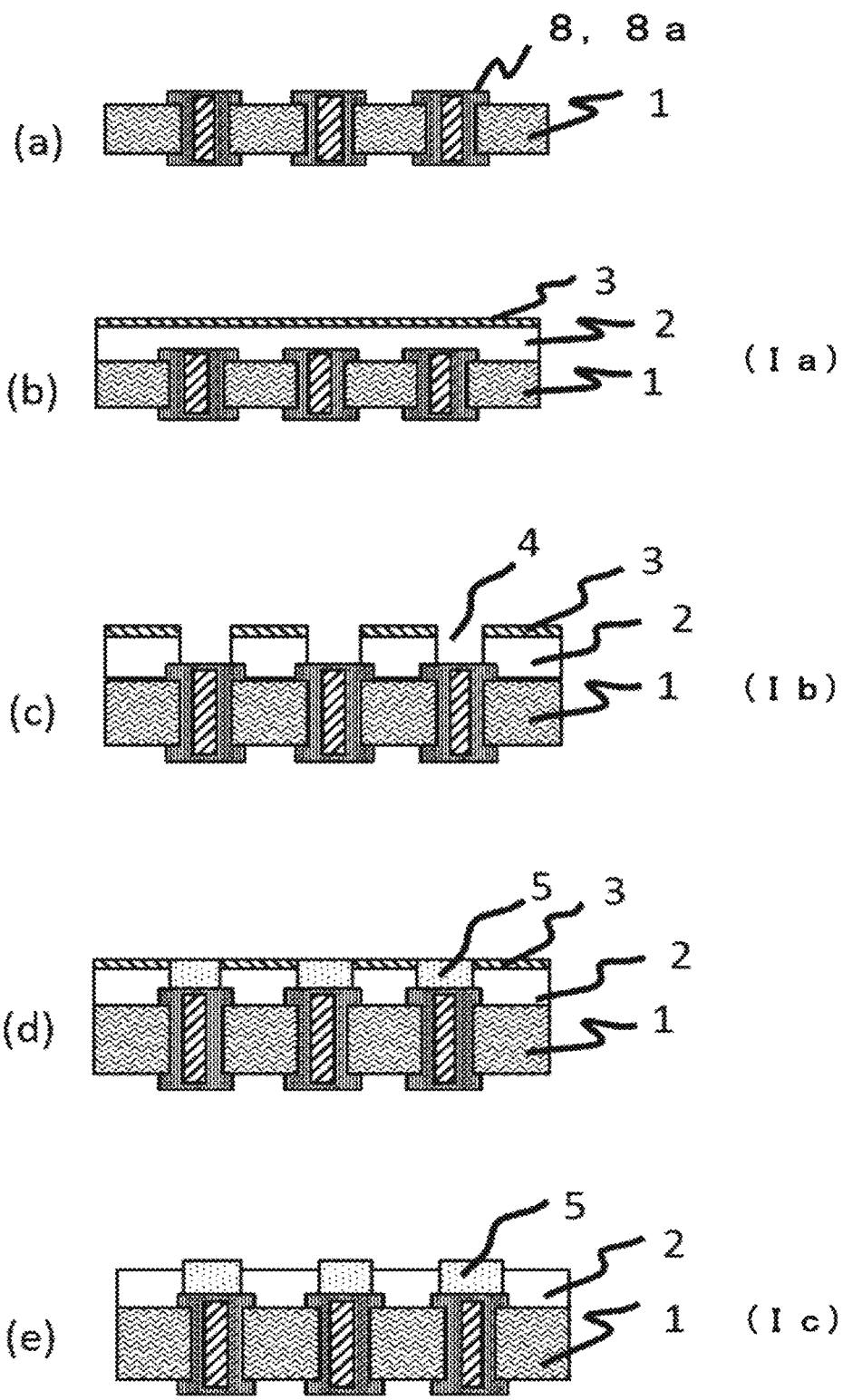
FIG. 2 is a schematic cross-sectional view showing a printed wiring board manufacturing step (I) in one embodiment of a method for manufacturing a multilayer wiring board of the present invention. (a) is a schematic cross-sectional view showing prepared first, second, and third printed wiring boards. (b) is a schematic cross-sectional view showing the state (Ia) where an insulating film attached to a protective mask is attached to the printed wiring board. (c) is a schematic cross-sectional view showing the state (Ib) where holes are formed by hole-boring on the insulating film in positions corresponding to electrical connection pads. (d) is a schematic cross-sectional view showing the state (Ic) where a conductive material is provided in the through holes formed in the insulating film. (e) is a schematic cross-sectional view showing the state where the protective film on the insulating film surface is released.

The steps of the manufacturing method of the present invention will be described with reference to FIGS. 1, 2, 3, and 4. First, as shown in FIG. 2(*a*), a first printed wiring board 1, a second printed wiring board 6, and a third printed wiring board 7 are manufactured. At this time, any one of a double-sided circuit board, a multilayer wiring board, and a multi-wire wiring board can be used for the first printed wiring board 1, the second printed wiring board 6, and the third printed wiring board 7; alternatively, different types of boards may be selected for the respective printed wiring boards. Further, there are no restrictions on the sizes and shapes of the first printed wiring board 1, the second printed wiring board 6, and the third printed wiring board 7, and different sizes and different shapes may be combined. Although there are no restrictions on the type of base material used for each printed wiring board, in order to control deformation (dimensional change) due to pressure heating during lamination, it is preferable to use an insulating base material containing a reinforcing material, such as glass cloth, particularly a base material of flame retardant (FR)-5 grade according to the National Electrical Manufacturers Association (NEMA) standard, or a base material having a high glass transition temperature (glass transition point), such as a polyimide resin-based material.

It is preferable that the first printed wiring board 1, the second printed wiring board 6, and the third printed wiring board 7 be printed wiring boards in which through holes are coated with electrolytic copper plating or electroless copper plating, and are filled with a nonconductive material and covered with a metal layer, i.e., furnished with hole filling and lid plating. This is because when the through holes in the printed wiring boards are filled with a nonconductive material, the central parts of the pads are composed of a nonconductive material and the contact area between the conductive material needed for a connection between the printed wiring boards and the connection parts of the printed wiring boards may decrease.

It is preferable that the surface finish of the first printed wiring board 1, the second printed wiring board 6, and the third printed wiring board 7 be gold plating. In general, copper plating is often used for ensuring the connectivity of the through hole and for lid plating. However, copper plating left in the atmosphere may be covered with a copper oxide film and its connectivity with the conductive material may decrease in some cases. It is preferable that gold be present on the surface in order to suppress poor connectivity due to oxidative deterioration.

In each of the first printed wiring board 1, the second printed wiring board 6, and the third printed wiring board 7, electrical connection pads are disposed on the surface electrically connected to another printed wiring board. In addition to electrical connection pads, non-connection pads and lands and, as needed, wiring may be provided on the surface to be electrically connected thereto.

(Attachment of Insulating Film (Ia))

Next, as shown in FIG. 2(b), an insulating film 2 is attached to at least one of the facing surfaces of the first printed wiring board 1 and the third printed wiring board 7. It is preferable that the insulating film 2 be attached to at least one of the facing surfaces between the printed wiring boards, and it is more preferable that the insulating films 2 be attached to both of the facing surfaces between the printed wiring boards. The insulating film 2 used in this case may be any film that has insulating properties but is preferably composed of one in which the flowability can be controlled or a film material of a resin composition containing a polymer component. Further, it is preferable that the insulating film be composed of a thermosetting resin. Furthermore, since it needs to withstand the reflow conditions at the time of component mounting, the glass transition temperature of the cured product is preferably 150° C. or higher, more preferably 180° C. or higher. An example of such an insulating film is AS-9500 (product name) manufactured by Hitachi Chemical Co., Ltd. Moreover, it is preferable that particles, such as a filler, be contained as a reinforcing material in order to suppress the coefficient of thermal expansion of the cured product of the insulating film. An example of such an insulating film is AS-300HS (product name) manufactured by Hitachi Chemical Co., Ltd. In this embodiment, an insulating film is a film composed of a resin composition or a film composed of a resin composition and a filler. The insulating film 2 may further contain fibers. However, in the case where fibers are contained, it is preferable that the length of the fibers be 200 μm or less from the viewpoint of avoiding adverse effects on small-diameter and small-pitch hole processing.

As in the first printed wiring board 1 and the third printed wiring board 7, in the second printed wiring board 6 and the third printed wiring board 7, it is preferable to attach an insulating film to at least one of the facing surfaces of the second printed wiring board 6 and the third printed wiring board 7, and it is more preferable to attach insulating films on both of the facing surfaces of the second printed wiring board 6 and the third printed wiring board 7.

It is preferable to provide a protective film (e.g., a PET film) on a surface of the insulating film. Foreign substances can be prevented from adhering to the surface of the insulating film in each step, and if holes are bored in the same positions as those in the insulating film in the next hole-boring process performed on the insulating film, at the time of providing a conductive paste thereafter, the protective film in which holes are bored can be used instead of a protective mask without preparing a dedicated protective mask in which openings are formed in the positions corresponding to the positions of the conductive paste for each product pattern, thereby reducing the manufacturing cost.

<Measurement of Glass Transition Point>

The glass transition temperature was measured by the following method.

(Sample Fabrication Method)

A thermosetting resin composition was applied on release PET (A-53 manufactured by Teijin DuPont Films) using an applicator so that the film thickness after drying would be 100 and the workpiece was dried at a temperature of 130° C. for 30 minutes, thereby fabricating a semi-cured film. Subsequently, the semi-cured film was released from the release PET and fixed by being sandwiched between two metal frames, and the workpiece was dried at a temperature of 185° C. for 60 minutes, thereby fabricating a film of a cured thermosetting resin composition.

(Measurement Method)

Measurement was performed using TMA manufactured by MAC Science Co., Ltd., under the following conditions: Jig: pull, distance between chucks: 15 mm, measuring temperature: room temperature to 350° C., rate of temperature increase: 10° C./min, tensile load: 5 gf, sample size: 5 mm (width)×25 mm (length). The glass transition temperature was determined by the tangent method from the obtained temperature-displacement curve.

(Hole-Boring in Insulating Film (Ib))

Figure 4:
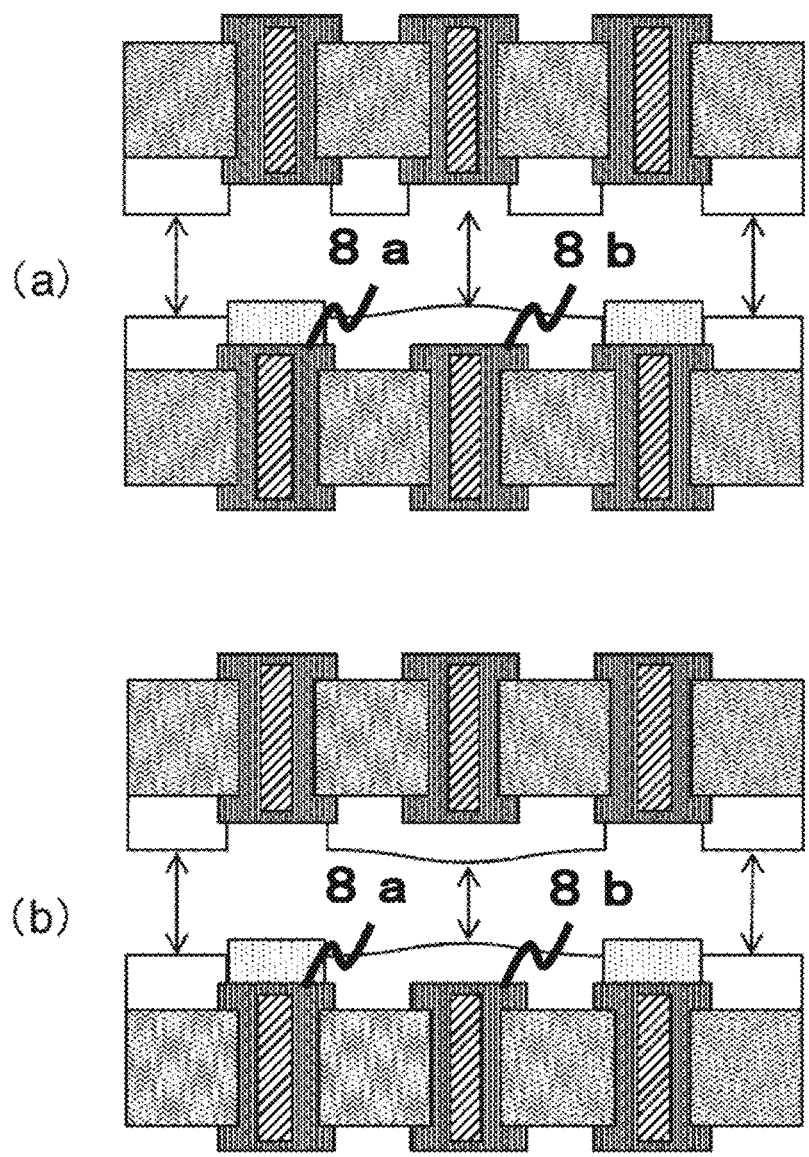
FIG. 4 is a schematic cross-sectional view showing the case where insulating films are attached to both of the facing surfaces of the printed wiring boards in one embodiment of a method for manufacturing a multilayer wiring board of the present invention. (a) is a schematic cross-sectional view showing the case where the surface of the insulating film on which holes are bored in positions corresponding to only the electrical connection pads (lower side) and the surface of the insulating film on which holes are bored in positions corresponding to both the electrical connection pads and the non-connection pads (upper side) face to each other. (b) is a schematic cross-sectional view showing the case where the surfaces of the insulating film on which holes are bored in positions corresponding to only the electrical connection pads (lower and upper sides) face each other.

Subsequently, it is preferable that, as shown in FIG. 2(c), hole-boring be performed so that electrical connection pads are exposed on the insulating film 2 attached to at least one of the facing surfaces of the first printed wiring board 1 and the third printed wiring board 7, and it is more preferable that hole-boring be performed on both surfaces so that electrical connection pads are exposed on the insulating films 2 attached to both of the facing surfaces of the first printed wiring board 1 and the third printed wiring board 7. In the case where hole-boring is performed on the insulating films 2 attached to both of the facing surfaces between the printed wiring boards, as shown in FIG. 4(*a*), it is preferable that, in the insulating film 2 on which the conductive paste is provided, holes be bored in the positions corresponding to only electrical connection pads, and in the insulating film 2 on which no conductive paste is provided, holes be bored in the positions corresponding to both electrical connection pads and non-connection pads. In the case where insulating films with holes bored only in the positions corresponding to the electrical connection pads are provided on both of the facing surfaces, the actual interlayer distance differs between the positions where the non-connection pads face each other and the positions where the electrical connection pads face each other (FIG. 4(*b*)), so that a connection failure may occur when they are joined to each other; however, when holes are bored in the insulating films as shown in FIG. 4(*a*), sufficient connection reliability can be ensured while ensuring insulating properties and causing no voids next to the pads.

Laser processing or drilling can be used as a hole-boring method in this case. It is preferable to use, as a processing machine for these, a processing machine having a function of reading surface pads position for alignment provided in the four corners of the printed wiring board by using a camera provided to the machine, and automatically correcting the offsets in the directions of X and Y, the scales in the directions of X and Y, and the rotation, by using a control software for the processing machine, because this allows alignment to be easily performed even in a high-density wiring board provided with minute electrical connection pads. Further, it is preferable to employ hole-boring using laser processing which provides holes with a small diameter more easily than that using drilling, leading to easy fabrication of a high-density multilayer wiring board having minute electrical connection pad pitches.

In hole-boring for the insulating film 2, it is sufficient to bore holes in the positions corresponding to electrical connection pads; however, in order to fabricate a printed wiring board with excellent positional accuracy and excellent connection reliability, it is preferable to bore holes with an opening diameter that is 0 to 200 μm smaller than the diameter of the electrical connection pads, and it is more preferable to bore holes with an opening diameter that is 50 to 100 μm smaller than the diameter of the electrical connection pads.

As in the first printed wiring board 1 and the third printed wiring board 7, in the second printed wiring board 6 and the third printed wiring board 7, the insulating film is subjected to hole-boring in the same process as in the first printed wiring board 1 and the third printed wiring board 7.

(Placement of Conductive Paste (Ic))

Subsequently, as shown in FIG. 2(*d*), on at least one of the facing surfaces of the first printed wiring board 1 and the third printed wiring board 7, a conductive paste is provided on the electrical connection pads exposed from the holes formed in the insulating film 2. Although any conductive paste that has conductivity may be used, it is preferable to use one that melts at the molding temperature (200° C. or lower) of a typical insulating material for printed wiring boards, because it can be processed concurrently with the insulating material. In addition, it is preferable to use a material that forms an intermetallic bond with a component in the conductive paste and a pad surface to be bonded, and has a remelting temperature of 250° C. or more after the formation, because this material yields a multilayer wiring board with high reliability that can withstand a thermal history at the time of surface mount using reflow. Examples of such a material include HT-710 (product name) manufactured by ORMET Co., Ltd. and MPA500 (product name) manufactured by TATSUTA Electric Wire and Cable Co., Ltd.

Similarly, on at least one of the surfaces of the second printed wiring board 6 and the third printed wiring board 7, a conductive paste is provided in the same process as in the first printed wiring board 1 and the third printed wiring board 7.

As a method of placing the conductive paste, a screen printing method or a dispenser method can be used, for example. Some conductive pastes are composed of a binder resin mixed with a metal material and thus have low viscosity so that screen printing or dispenser processing is facilitated. In use of such a conductive paste, it is preferable to perform heat treatment after the placement of the conductive paste to preliminarily cure the binder resin to increase the viscosity so that the shape of the conductive paste can be maintained in the subsequent process. At this time, if the temperature is 70° C. or less and the time is 10 minutes or less, the viscosity cannot be sufficiently increased and the shape may collapse in some cases. In addition, if the temperature is 150° C. or more and the time is 120 minutes or more, the viscosity becomes too high and the curing of the binder resin proceeds; thus, even if the conductive material melts, a satisfactory intermetallic compound cannot be formed or deformation cannot be achieved at the time of lamination, so that sufficient connectivity may not be ensured in some cases.

Note that, as shown in FIG. 2(*e*), in use of one having the protective film 3 on the surface of the insulating film 2, the protective film 3 is released.

<Lamination Step (II)>

Figure 3:
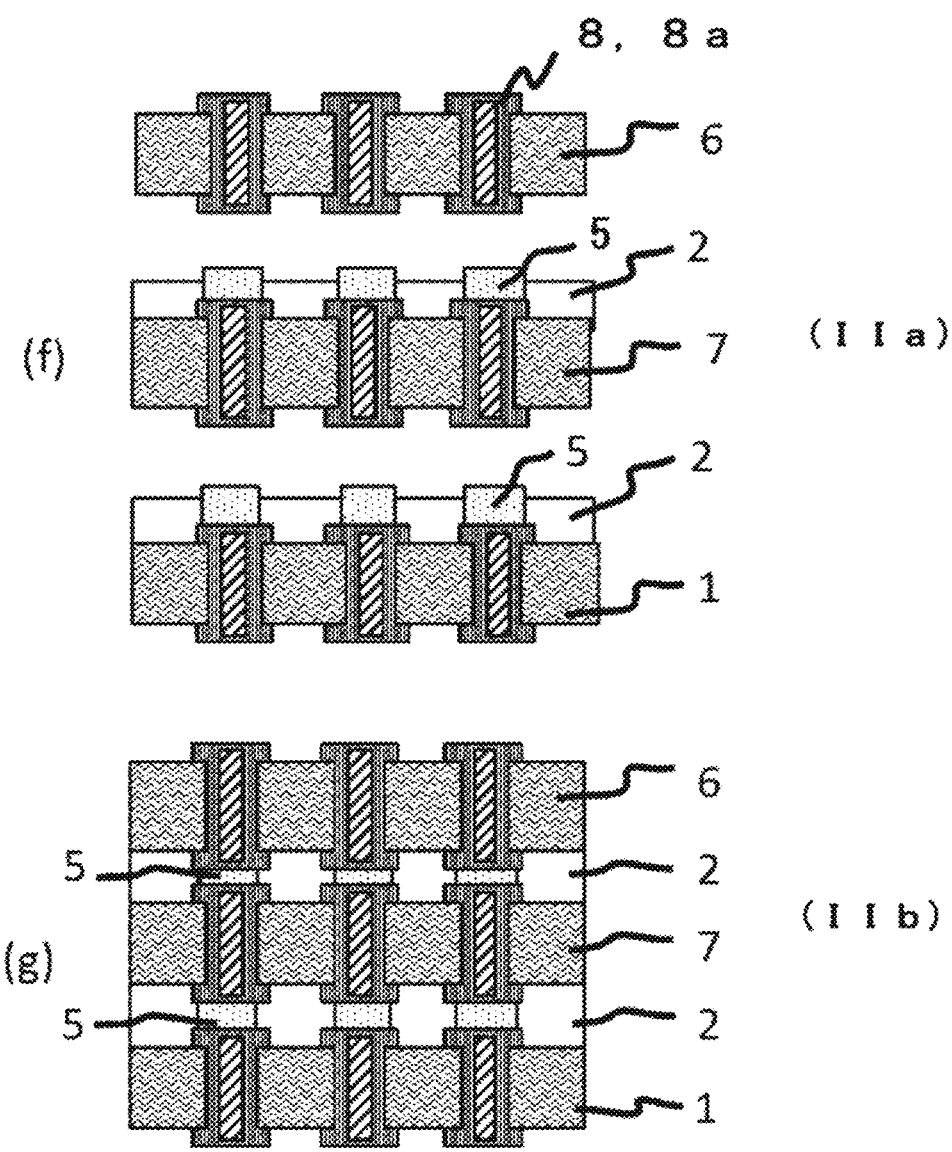
FIG. 3 is a schematic cross-sectional view showing a lamination step (II) of one embodiment of a method for manufacturing a multilayer wiring board of the present invention. (f) is a schematic cross-sectional view showing the state (IIa) where the three printed wiring boards, i.e., the first, second, and third printed wiring boards are overlaid on one another so that the surface on which the conductive material is provided and the surface on which no conductive material is provided face each other. (g) is a schematic cross-sectional view showing the state (IIb) after lamination by heating and pressurization.

Next, as shown in FIG. 3(*f*), (IIa) one first printed wiring board 1, at least one third printed wiring board 7, and one second printed wiring board 6 are laminated in this order so that the surface on which the conductive paste is provided and the surface on which the conductive paste is not provided face each other, and (IIb) heating and pressure lamination are performed, as shown in FIG. 3(*g*). Consequently, an electrical connection is established between the respective printed wiring boards. In use of one having a protective film on the surface of the insulating film, the protective film is released before the printed wiring boards are overlaid on one another.

At the time of lamination, it is preferable that a plurality of alignment holes be provided in the same positions on the planes of the first printed wiring board 1, the second printed wiring board 6, and the third printed wiring board 7; pins, which are shorter than the board thickness of the multilayer wiring board after lamination and longer than the total thickness of the laminated first printed wiring board 1 and the third printed wiring board 7, be inserted into the alignment holes in the first printed wiring board 1; and the pins be inserted into the alignment holes provided in the third printed wiring board 7 and further into the alignment holes provided in the second printed wiring board 6 so that lamination is achieved while performing alignment between the printed wiring boards, thereby attaining accurate alignment between the printed wiring boards.

EXAMPLES

Example 1

With a glass epoxy multilayer material (E-679 (product name) manufactured by Hitachi Chemical Co., Ltd.), a 26-layer wiring board having a board size of 500 mm×500 mm and a board thickness of 3.0 mm was formed. Using a drill having a diameter of 0.15 mm, 20000 holes were bored with a pattern with a minimum pitch of 0.40 mm between the through holes. The inner walls of the holes were copper-plated for establishing an electrical connection, and all the holes were resin-filled with a hole-filling resin (THP-100DX1 (product name) manufactured by Taiyo Ink Mfg. Co., Ltd.). Subsequently, thick electroless copper plating with a thickness of 40 μm was given as lid plating. On one of the surface layers of the printed wiring board, electrical connection pads with a diameter of 0.30 mm were provided in the positions corresponding to the through holes. Further, alignment holes with a diameter of 5.0 mm were provided in the positions in the four corners of a 490 mm×490 mm area on the board. This board was used as a first printed wiring board.

Next, a 26-layer wiring board having a board thickness of 3.0 mm was formed using the same material and process as those of the first printed wiring board, thereby providing a second printed wiring board. At this time, on one of the surface layers of the second printed wiring board, electrical connection pads with a diameter of 0.30 mm were provided in the positions corresponding to the 20000 through holes. Further, alignment holes with a diameter of 5.0 mm were provided in the positions in the four corners of a 490 mm×490 mm area on the board.

Next, an insulating film (AS-300HS (product name) manufactured by Hitachi Chemical. Co., Ltd.) having a size of 510 mm×510 mm, a PET film having a thickness of 0.025 mm on one side, and a nominal thickness of 0.065 mm was provided on the surface of the first printed wiring board, on which the electrical connection pads were provided, so that the insulating film is brought in contact with the electrical connection pads, and was attached thereto using a vacuum laminator at a temperature of 85° C. with a pressure of 0.5 MPa for a pressurization time of 30 seconds (30-seconds vacuuming).

Next, for the first printed wiring board, hole-boring of the insulating film was performed so that the electrical connection pads were exposed on the surface to which the insulating film was attached, using a $CO_2$ laser processing machine. At this time, the finished diameter of the holes to be bored in the insulating film was set to 0.25 mm, and the alignment between the surface patterns and the hole positions in the printed wiring board was performed by reading the positions of the alignment surface pads provided in the four corners of the printed wiring board through a camera provided to the laser processing machine and correcting the offsets in the directions of X and Y, the scales in the directions of X and Y, and the rotation through a control software for the processing machine.

Next, using a screen printing machine, the holes were filled with a conductive paste (MPA500 (product name) manufactured by TATSUTA Electric Wire and Cable Co., Ltd) by the screen printing method. The number of holes that were filled was 20000. At this time, the screen plate was a metal mask having a thickness of 0.1 mm, and an opening of 480 mm×480 mm serving as a printing area. The PET film attached to the surface of the insulating film was used as a protective mask for the portions of the surface of the printed wiring board where no conductive paste was provided.

Next, the 0.025-mm-thick PET film adhering to the surface of the insulating film was released from the insulating material.

Next, the first printed wiring board and the second printed wiring board were overlaid on each other, and the workpiece was heated and pressed by a vacuum press under the following press conditions: at a temperature of 180° C. for 90 minutes with a pressure of 3 MPa, thereby bonding them to each other. At this time, the second printed wiring board was overlaid so that the surface of the first printed wiring board on which the conductive paste was provided and the surface of the second printed wiring board on which no conductive paste was provided face. The alignment between the first printed wiring board and the second printed wiring board was performed by inserting pins, which have a length of 5 mm and a diameter of 5.0 mm, in 5.0-mm-diameter alignment holes preliminarily drilled in positions in the four corners of a 490 mm×490 mm area on the planes of the first printed wiring board and the second printed wiring board.

Example 2

A multilayer wiring board was manufactured in the same manner as in Example 1 except that a polyimide multilayer material (I-671 (product name) manufactured by Hitachi Chemical Co., Ltd.) was used for the first printed wiring board and the second printed wiring board.

Example 3

A multilayer wiring board was manufactured in the same manner as in Example 1 except that AS-9500 (product name) manufactured by Hitachi Chemical Co., Ltd. was used for the insulating film.

Example 4

A board was manufactured in the same manner as in Example 1 except that drilling was used for hole-boring of the insulating film. As a drill used for processing, a drill having a diameter of 0.25 mm and a tip angle of 140 degrees was used. To control the depths of holes, the position of the board surface was detected by a sensor provided to the hole-boring machine, and the amount of processing from the surface was set to 0.130 mm. Further, the positions of the alignment surface pads provided in the four corners of the printed wiring board were read through a camera provided to the machine and the offsets in the directions of X and Y, the scales in the directions of X and Y, and the rotation were corrected through a control software for the processing machine.

Example 5

A multilayer wiring board was manufactured in the same manner as in Example 1 except that the drying treatment was carried out at 70° C. for 10 minutes in an electric dryer immediately after filling with the conductive paste.

Example 6

A multilayer wiring board was manufactured in the same manner as in Example 1 except that the drying treatment was carried out at 150° C. for 90 minutes in an electric dryer immediately after filling with the conductive paste.

Example 7

A multilayer wiring board was manufactured in the same manner as in Example 1 except that a multiwire wiring board having a board thickness of 3.0 mm, four signal layers using insulated wires, and a total of 18 layers was used as the first printed wiring board.

Example 8

Using a glass epoxy multilayer material (E-679 (product name) manufactured by Hitachi Chemical Co., Ltd.), an 18-layer wiring board having a board size of 500 mm×500 mm and a board thickness of 2.0 mm was formed. Using a drill having a diameter of 0.15 mm, 20000 holes were bored with a pattern with a minimum pitch of 0.40 mm between the through holes. All the holes were resin-filled with a hole-filling resin (THP-100DX1 (product name) manufactured by Taiyo Ink Mfg. Co., Ltd.). Subsequently, thick electroless copper plating with a thickness of 40 µm was given as lid plating. On one of the surface layers of the board, electrical connection pads with a diameter of 0.30 mm were provided in the positions corresponding to the through holes. Further, holes with a diameter of 5.0 mm were provided in the positions in the four corners of a 490 mm×490 mm area on the board. This board was used as a first printed wiring board.

Next, an 18-layer wiring board having a board thickness of 2.0 mm was formed using the same material composition and process as those of the first printed wiring board, thereby providing a second printed wiring board. At this time, on one of the surface layers of the second printed wiring board, electrical connection pads with a diameter of 0.30 mm were provided in the positions corresponding to the 20000 through holes. Further, alignment holes with a diameter of 5.0 mm were provided in the positions in the four corners of a 490 mm×490 mm area on the board.

Next, an 18-layer wiring board having a board thickness of 2.0 mm was formed using the same material composition and process as those of the first printed wiring board, thereby providing a third printed wiring board. At this time, on both of the surface layers of the second printed wiring board, electrical connection pads with a diameter of 0.30 mm were provided in the positions corresponding to the 20000 through holes. Further, alignment holes with a diameter of 5.0 mm were provided in the positions in the four corners of a 490 mm×490 mm area on the board.

Next, an insulating film (AS-300HS (product name) manufactured by Hitachi Chemical Co., Ltd.) having a size of 510 mm×510 mm, a PET film having a thickness of 0.025 mm on one side, and a nominal thickness of 0.075 mm was provided on the surface of the first printed wiring board on which the electrical connection pads were provided, so that the insulating film is brought in contact with the electrical connection pads, and was attached thereto using a vacuum laminator at a temperature of 85° C. with a pressure of 0.5 MPa for a pressurization time of 30 seconds (30-seconds vacuuming).

Next, an insulating film (AS-300HS (product name) manufactured by Hitachi Chemical Co., Ltd.) having a size of 510 mm×510 mm, a PET film having a thickness of 0.025 mm on one side, and a nominal thickness of 0.065 mm was provided on one of the surfaces of the third printed wiring board on which the electrical connection pads were provided, so that the insulating film is brought in contact with the electrical connection pads, and was attached thereto using a vacuum laminator at a temperature of 85° C. with a pressure of 0.5 MPa for a pressurization time of 30 seconds (30-seconds vacuuming).

Next, for each of the first printed wiring board and the third printed wiring board, hole-boring of the insulating film was performed so that the connection pads were exposed on the surface to which the insulating film was attached, using a $CO_2$ laser processing machine. At this time, the finished diameter of the holes was set to 0.30 mm, and the alignment between the surface patterns and the hole positions in the printed wiring board was performed by reading the positions of the alignment surface pads provided in the four corners of the printed wiring board through a camera provided to the laser processing machine and correcting the offsets in the directions of X and Y, the scales in the directions of X and Y, and the rotation through a control software for the processing machine.

Next, for each of the first printed wiring board and the third printed wiring board, using a screen printing machine, the holes were filled with a conductive paste (MPA500 (product name) manufactured by TATSUTA Electric Wire and Cable Co., Ltd) by the screen printing method. At this time, the screen plate was a metal mask having a thickness of 0.1 mm, and an opening of 480 mm×480 mm serving as a printing area. Further, the PET film attached to the surface of the insulating film was used as a protective mask for the portions of the surface of the printed wiring board where no conductive paste was provided.

Next, the PET film adhering to the surface of the insulating film was released from the insulating material.

Next, the first printed wiring board, the third printed wiring board, and the second printed wiring board were overlaid on one another, and the workpiece was heated and pressed by a vacuum press under the following press conditions: at a temperature of 180° C. for 90 minutes with a pressure of 3 MPa, thereby bonding them to each other. At this time, a third printed wiring board was overlaid over the surface of the first printed wiring board on which the conductive paste was provided, so that the surface of the third printed wiring board on which no conductive paste was provided faced thereto, and the second printed wiring board was overlaid over the surface of the third printed wiring board on which the conductive paste was provided, so that the surface of the second printed wiring board on which no conductive paste was provided faced thereto. The alignment between the printed wiring boards was performed by inserting pins, which have a length of 5 mm and a diameter of 5.0 mm, in 5.0-mm-diameter holes preliminarily drilled in positions in the four corners of a 490 mm×490 mm area on the planes of the first printed wiring board, the second printed wiring board, and the third printed wiring board.

Comparative Example 1

Using a glass epoxy multilayer material (E-679 (product name) manufactured by Hitachi Chemical Co., Ltd.), a 26-layer wiring board having a board size of 500 mm×500 mm and a thickness of 3.0 mm was formed. Using a drill having a diameter of 0.15 mm, 20000 holes were bored with a pattern with a minimum pitch of 0.40 mm between the through holes. The inner walls of the holes were copper-plated for establishing an electrical connection, and all the holes were resin-filled with a hole-filling resin (THP-100DX1 (product name) manufactured by Taiyo Ink Mfg. Co., Ltd.). Subsequently, thick electroless copper plating with a thickness of 40 µm was given as lid plating. On one of the surface layers of the board, electrical connection pads with a diameter of 0.30 mm were provided in the positions corresponding to the through holes. Further, alignment holes with a diameter of 5.0 mm were provided in the positions in the four corners of a 490 mm×490 mm area on the board. This board was used as a first printed wiring board.

Next, a 26-layer wiring board having a board thickness of 3.0 mm was formed using the same material and process as those of the first printed wiring board, thereby providing a second printed wiring board. At this time, on one of the surface layers of the second printed wiring board, electrical connection pads with a diameter of 0.30 mm were provided in the positions corresponding to the 20000 through holes. Further, alignment holes with a diameter of 5.0 mm were provided in the positions in the four corners of a 490 mm×490 mm area on the board.

Next, a prepreg having a nominal thickness of 0.06 mm (E-679F (product name) manufactured by Hitachi Chemical Co., Ltd.) was used, and holes with a finished diameter of 0.25 mm were bored in this prepreg by using a $CO_2$ laser processing machine.

Next, the holes provided in the prepreg were filled with a conductive paste (MPA500 (product name) manufactured by TATSUTA Electric Wire and Cable Co., Ltd) by using a metal mask.

Next, the first printed wiring board, the prepreg with the holes filled with the conductive paste, and the second printed wiring board were overlaid on one another, and the workpiece was heated and pressed by a vacuum press under the following press conditions: at a temperature of 180° C. for 90 minutes with a pressure of 3 MPa, thereby bonding them to each other. At this time, they were arranged so that the surfaces of the first printed wiring board and the second printed wiring board on which the connection pads were provided faced each other, and they were overlaid on one another so that the prepreg was sandwiched between the first printed wiring board and the second printed wiring board. The alignment between the first printed wiring board, the prepreg, and the second printed wiring board was performed by inserting pins, which have a length of 5 mm and a diameter of 5.0 mm, in 5.0-mm-diameter alignment holes preliminarily drilled in positions in the four corners of a 490 min×490 mm area on the planes of the first printed wiring board, the prepreg, and the second printed wiring board.

Comparative Example 2

Using a glass epoxy multilayer material (E-679 (product name) manufactured by Hitachi Chemical Co., Ltd.), a 26-layer wiring board having a board size of 500 mm×500 mm and a thickness of 3.0 mm was formed. Using a drill having a diameter of 0.15 mm, 20000 holes were bored with a pattern with a minimum pitch of 0.40 mm between the through holes. The inner walls of the holes were copper-plated for establishing an electrical connection, and all the holes were resin-filled with a hole-filling resin (THP-100DX1 (product name) manufactured by Taiyo Ink Mfg. Co., Ltd.). Subsequently, thick electroless copper plating with a thickness of 40 μm was given as lid plating. On one of the surface layers of the board, electrical connection pads with a diameter of 0.25 mm were provided in the positions corresponding to the through holes. Further, alignment holes with a diameter of 5.0 mm were provided in the positions in the four corners of a 490 mm×490 mm area on the board. This board was used as a first printed wiring board.

Next, a 26-layer wiring board having a board thickness of 3.0 mm was formed using the same material and process as those of the first printed wiring board, thereby providing a second printed wiring board. At this time, on one of the surface layers of the second printed wiring board, electrical connection pads with a diameter of 0.30 mm were provided in the positions corresponding to the 20000 through holes. Further, alignment holes with a diameter of 5.0 mm were provided in the positions in the four corners of a 490 mm×490 mm area on the board.

Next, a eutectic solder paste (M705-WSG36-T5K (product name) manufactured by Senju Metal Industry Co., Ltd.) was screen-printed on the electrical connection pads on the first printed wiring board by using a metal mask, and the workpiece was subjected to reflow treatment at a peak temperature of 235° C. for 5 seconds, thereby forming angle solder bumps having a height of 0.13 mm.

Next, the first printed wiring board, an insulating film AS-300HS having a nominal thickness of 0.060 mm, and the second printed wiring board were overlaid on one another, and the workpiece was heated and pressed by a vacuum press under the following press conditions: at a temperature of 180° C. for 90 minutes with a pressure of 3 MPa, thereby bonding them to each other. At this time, the printed wiring boards were overlaid on each other so that the solder bumps formed on the first printed wiring board faced to the electrical connection pads on the second printed wiring board, and were arranged so that an insulating film AS-300HS having a nominal thickness of 0.075 mm was sandwiched between the first printed wiring board and the second printed wiring board. The alignment between the printed wiring boards was performed by inserting pins, which have a length of 5 mm and a diameter of 5.0 mm, in 5.0-mm-diameter alignment holes preliminarily drilled in positions in the four corners of a 490 mm×490 mm area on the planes of the first printed wiring board and the second printed wiring board.

Comparative Example 3

A prepreg (E-679F (product name) manufactured by Hitachi Chemical Co., Ltd.) having a nominal thickness 0.06 mm was used. The prepreg was provided on the surface of the first printed wiring board on which the electrical connection pads were provided, so that the prepreg was brought in contact with the electrical connection pads, and was attached thereto using a vacuum press at a temperature of 0.150° C. with a pressure of 1.0 MPa for a pressurization time of 30 minutes with vacuuming. In addition, the printing with a conductive paste employed a metal mask having openings, which have the same diameter as the holes in the insulating film, in the positions corresponding to only the holes provided with the paste. Aside from that, a multilayer wiring board was manufactured in the same conditions as in Example 1.

The characteristics of the multilayer wiring boards manufactured in Examples and Comparative Examples were evaluated as follows.

Ten daisy chain patterns including bonding points of 400 holes and inner layer connections between the bonded first printed wiring board, second printed wiring board, and third printed wiring board were used as evaluation patterns. For the initial connection resistance value, the resistance was measured at the starting end point and the ending end point of one daisy chain pattern by using a milliohm meter, the measured resistance was then divided by 400 holes to determine the connection resistance value for one point, and the average was then determined for all 10 patterns.

The connection resistance value after reflow heat resistance was evaluated for ten daisy chain patterns for which the initial connection resistance value was measured. The treatment was carried out three times at a peak temperature of 235° C. for 5 seconds by using a reflow apparatus. After the reflow treatment, the connection resistance value was measured using a milliohm meter, and the average was determined for all 10 patterns.

The evaluation results for Examples are shown in Tables 1 and 2.

TABLE 1

| Item | Example 1 | Example 2 | Example 3 | Example 4 | Example 5 | Example 6 |
| --- | --- | --- | --- | --- | --- | --- |
| Initial connection resistance value (mΩ) | 3.5 | 3.7 | 3.6 | 3.5 | 3.4 | 3.2 |
| Connection resistance value after reflow heat resistance (mΩ) | 3.6 | 3.6 | 3.6 | 3.5 | 3.5 | 3.2 |

TABLE 2

| Item | Example 7 | Example 8 |
| --- | --- | --- |
| Initial connection resistance value (mΩ) | 3.2 | 3.8 |
| Connection resistance value after reflow heat resistance (mΩ) | 3.3 | 4.0 |

The evaluation results for Comparative Examples are shown in Table 3.

TABLE 3

| Item | Comparative Example 1 | Comparative Example 2 | Comparative Example 3 |
| --- | --- | --- | --- |
| Initial connection resistance value (mΩ) | Disconnection | Disconnection | Disconnection |
| Connection resistance value after reflow heat resistance (mΩ) | Disconnection | Disconnection | Disconnection |

As shown in Tables 1 to 3, in the multilayer wiring boards fabricated by the manufacturing methods of Comparative Examples, disconnection is observed from the initial connection resistance value, whereas in the multilayer wiring boards fabricated by the manufacturing methods of Examples, disconnection is not observed from the initial connection resistance value and the connection resistance value after reflow heat resistance; thus, the method for manufacturing a multilayer wiring board of the present invention can provide a high-density multilayer wiring board exhibiting excellent connection reliability and having minute junction terminal pitches.

REFERENCE SIGNS LIST

1 . . . first printed wiring board, 2 . . . insulating film, 3 . . . protective film, 4 . . . holes to be filled with conductive paste, 5 . . . conductive paste, 6 . . . second printed wiring board, 7 . . . third printed wiring board, 8 . . . pad, 8a . . . electrical connection pad, 8b . . . non-connection pad.

The invention claimed is:

1. A method for manufacturing a multilayer wiring board, said method comprising steps of:
preparing a plurality of printed wiring boards having both electrical connection pads for establishing an electrical connection between the printed wiring boards and non-connection pads for not establishing an electrical connection between the printed wiring boards on a same plane, wherein at least one of the plurality of printed wiring boards includes a through-hole covered by a metal layer to form at least one of the electrical connection pads; and
overlaying the plurality of printed wiring boards so that the electrical connection pads face each other, and
laminating the plurality of printed wiring boards so that the printed wiring boards are bonded to each other through a conductive paste provided between the facing electrical connection pads,
wherein the preparing further comprises: attaching an insulating film to at least one of surfaces faced when the plurality of printed wiring boards are overlaid in the overlaying; boring holes in the insulating film in positions corresponding to the at least one electrical connection pad on the surface having the attached insulating film so that the electrical connection pad is exposed; and providing a conductive paste in the holes bored in the insulating film.

2. The method for manufacturing a wiring board according to claim 1, wherein in the preparing, a thermosetting resin composition having a glass transition temperature of 180° C. or more is used in the insulating film.

3. The method for manufacturing a wiring board according to claim 1, wherein in the preparing, the insulating film includes a reinforcement filler.

4. The method for manufacturing a multilayer wiring board according to claim 1, wherein in the preparing, laser processing or hole-boring drilling is used for boring holes in the insulating film.

5. The method for manufacturing a multilayer wiring board according to claim 1, wherein in the preparing, a PET film is used as a protective mask when the conductive paste is provided in the holes formed in the insulating film.

6. The method for manufacturing a multilayer wiring board according to claim 1, wherein in the preparing, the printed wiring boards are subjected to heat treatment at a temperature of 70 to 150° C. for 10 to 120 minutes, after the conductive paste is provided in the holes formed in the insulating film and before the overlaying of the plurality of printed wiring boards.

7. The method for manufacturing a multilayer wiring board according to claim 1, wherein in the overlaying, a plurality of alignment holes are provided in common portions on the planes of the printed wiring boards to be integrally laminated, and pins are inserted into the provided alignment holes, so that the integral lamination is performed while performing alignment between the printed wiring boards.

8. The method for manufacturing a multilayer wiring board according to claim 1, wherein in the overlaying, a portion of the surface provided with the pads for establishing an electrical connection between the printed wiring boards is filled with an insulating material, the portion being not provided with the pads for establishing an electrical connection between the printed wiring boards.

9. The method for manufacturing a multilayer wiring board according to claim 1, wherein in the preparing, the insulating film has a thickness larger than a thickness of conductor circuits of the electrical connection pads exposed from the holes formed in the insulating film when (Ib) the holes are bored in the insulating film so that the electrical connection pads are exposed.

10. The method for manufacturing a multilayer wiring board according to claim 1, wherein in the preparing, the holes formed in the insulating film by hole-boring in positions corresponding to the electrical connection pads are all filled with a conductive paste in the boring holes in the insulating film so that the electrical connection pads are exposed.

11. The method for manufacturing a multilayer wiring board according to claim 1, wherein the metal layer includes gold plating.

12. The method for manufacturing a multilayer wiring board according to claim 1, wherein the through-hole covered by a metal layer in the at least one of the plurality of printed wiring boards is filled with nonconductive material.

13. The method for manufacturing a multilayer wiring board according to claim 1, wherein in the preparing, the holes bored in the insulating film each have an opening diameter that is 0 to 200 μm smaller than the diameter of the electrical connection pads.

14. The method for manufacturing a multilayer wiring board according to claim 1, wherein the insulating film includes fibers each having 200 μm-or-less in length.

* * * * *